(12) United States Patent
Nishioka et al.

(10) Patent No.: US 12,014,897 B2
(45) Date of Patent: Jun. 18, 2024

(54) VENTILATED SEMICONDUCTOR PROCESSING APPARATUS

(71) Applicant: Hitachi High-Tech Corporation, Tokyo (JP)

(72) Inventors: Akira Nishioka, Tokyo (JP); Shuichi Nakagawa, Tokyo (JP); Masaki Mizuochi, Tokyo (JP); Takaaki Kikuchi, Tokyo (JP); Masashi Fujita, Tokyo (JP); Kenta Nomura, Tokyo (JP); Naoya Ishigaki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 457 days.

(21) Appl. No.: 17/373,921

(22) Filed: Jul. 13, 2021

(65) Prior Publication Data

US 2022/0076918 A1 Mar. 10, 2022

(30) Foreign Application Priority Data

Sep. 8, 2020 (JP) ................. 2020-150211

(51) Int. Cl.
*H01J 37/26* (2006.01)
*H01J 37/34* (2006.01)
*H01L 21/677* (2006.01)
*H05K 7/20* (2006.01)

(52) U.S. Cl.
CPC ........ *H01J 37/261* (2013.01); *H01J 37/3497* (2013.01); *H01L 21/67739* (2013.01); *H05K 7/20* (2013.01)

(58) Field of Classification Search
CPC ............... H01L 21/67739; H05K 7/20; H05K 7/20136; H05K 7/20145
See application file for complete search history.

(56) References Cited

U.S. PATENT DOCUMENTS

2003/0164179 A1   9/2003  Kamikawa et al.
2015/0314325 A1*  11/2015 Ko ........................ H10K 99/00
                                                427/256
2019/0252223 A1*  8/2019  Minamida ......... H01L 21/67201

FOREIGN PATENT DOCUMENTS

| JP | 7-335707 A    |   | 12/1995 |
|----|---------------|---|---------|
| JP | H10107016 A   | * | 4/1998  |
| JP | 2002093878 A  | * | 3/2002  |
| JP | 2003-257923 A |   | 9/2003  |
| JP | 2005-268546 A |   | 9/2005  |
| JP | 2009-16743 A  |   | 1/2009  |
| JP | 2019-140379 A |   | 8/2019  |

OTHER PUBLICATIONS

Japanese-language Office Action issued in Japanese Application No. 2020-150211 dated Nov. 28, 2023 with English translation (6 pages).

* cited by examiner

*Primary Examiner* — Vivek K Shirsat
*Assistant Examiner* — Michael James Giordano
(74) *Attorney, Agent, or Firm* — Crowell & Moring LLP

(57) ABSTRACT

A semiconductor processing apparatus according to the present invention includes a main body cover that covers a main body device and a control device. The main body cover has a transfer opening for transferring a semiconductor, and the main body cover further has an intake port that generates an air flow in a horizontal direction inside the main body cover.

15 Claims, 5 Drawing Sheets

VENTILATED SEMICONDUCTOR PROCESSING APPARATUS

BACKGROUND OF THE INVENTION

1. Field of the Invention

The present invention relates to a semiconductor processing apparatus that inspects and processes a semiconductor.

2. Description of the Related Art

Along with miniaturization of a semiconductor element in recent years, a technique for handling a position of a semiconductor with high accuracy is required not only for a semiconductor manufacturing apparatus but also for an apparatus for inspecting and evaluating a semiconductor. For example, as an apparatus that measures and inspects a shape and the dimension of a circuit formed on a semiconductor wafer, there is a critical dimension scanning electron microscope (SEM) that captures an image using an electron microscope and reads the dimension of the circuit.

In a current semiconductor circuit, circuits are formed with a line width of several nanometers, and the circuits are arranged at intervals of the same order. When this is imaged and inspected with an electron microscope, imaging is performed in an extremely small field of view. Therefore, even when a slight temperature change occurs in a stage device that positions a semiconductor wafer, the position of the semiconductor wafer being stopped moves due to thermal deformation of the apparatus. In that case, it may be difficult to know which part is being imaged. In the critical dimension SEM, since an electron microscope is used, it is necessary to place a semiconductor wafer as a sample in a vacuum chamber, and this chamber is referred to as a sample chamber. Since the stage device is provided inside the sample chamber to position the semiconductor wafer, it is necessary to keep a temperature of the sample chamber itself as constant as possible.

Similarly, also in a semiconductor manufacturing apparatus, even in a case where a device or the like that positions a semiconductor wafer causes a slight temperature change, a position of a semiconductor circuit to be manufactured is shifted. Therefore, for a device that positions a wafer, it is important to suppress a temperature change as much as possible to stabilize the temperature with high accuracy.

In contrast, in a case where a device using an electron beam such as an electron microscope is incorporated, when noise of an electromagnetic wave enters from the outside, a slight change occurs in the track of the electron beam, which causes deterioration in accuracy. Therefore, in a semiconductor processing apparatus, it is effective to cover the entire apparatus with a metal cover to suppress the entry of electromagnetic noise in order to improve accuracy. Further, in an apparatus pursuing precision on the order of nanometers, there is also a problem that sound vibrates the apparatus due to entry of a sound wave, and a motion of the vibration becomes noise. Therefore, covering an apparatus main body with the cover also has a role of preventing entry of a sound wave due to noise generated by other surrounding devices. However, a semiconductor processing apparatus uses various control devices in order to drive a main device of the apparatus, and the main device and the control device form one device as a set. Therefore, a main body cover includes a large number of control devices in addition to the main device. The control devices here include, for example, a power supply device for the control devices.

In the control device, heat generation associated with energy loss occurs when electricity is used. Individual heat generation is dissipated via air if there is a flow of air around a part. However, when looking at the entire apparatus, heat generation of an individual part leads to an increase in the air temperature inside the cover. Such an increase in the air temperature leads to thermal deformation of a device that touches a semiconductor wafer, leading to deterioration of accuracy. Generally, a semiconductor processing apparatus is used in a clean room. In a clean room, it is usual to keep the air temperature constant and remove dust in the air. However, in the apparatus covered with a main body cover, there is a factor that causes the temperature change of the air as described above.

JP H07-335707 A describes a technique related to the above. JP H07-335707 A describes a means for preventing an increase in the air temperature inside a semiconductor processing apparatus by placing a blower in a machine room corresponding to a back yard of a clean room, sucking air from the semiconductor processing apparatus through a duct, and sucking temperature-controlled air in the clean room by the semiconductor processing apparatus.

JP 2005-268546 A describes a technique for effectively cooling a control device used in a semiconductor processing apparatus. In this technique, a rack in which a plurality of housing units constituting a control device are stacked and stored is configured, an air guide chamber is provided between the rack and an exhaust duct, and an air flow rate sucked into the exhaust duct is adjusted by an adjustment plate in the air guide chamber, so that a plurality of the housing units are uniformly cooled.

SUMMARY OF THE INVENTION

As a means for keeping the internal air temperature of a semiconductor processing apparatus constant, there is a method in which a blower is installed in a room different from a clean room in which the apparatus is placed, the blower and the semiconductor processing apparatus are connected by a duct, and exhaust heat of the semiconductor processing apparatus is discharged by the blower. In this case, every time a semiconductor processing apparatus is installed, construction of the exhaust duct is required, and a load for installing the apparatus is large.

In contrast, there is also a method in which a semiconductor processing apparatus includes an exhaust fan, and exhaust heat of the apparatus is discharged into a clean room. In this case, the exhaust duct does not need to be constructed. On the other hand, when the semiconductor processing apparatus has a large fan such as a blower, the apparatus itself receives vibration and noise of the blower, which interferes with precise operation. In order to suppress the vibration and noise of the fan, it is preferable to use a fan having a lower output than the blower. However, the lower the output, the lower the vibration and noise, and the lower the exhaust flow rate.

In view of the above, a technique for keeping the internal air temperature of a semiconductor processing apparatus constant even with a small exhaust flow rate is required. In particular, in an apparatus such as a critical dimension SEM, various control devices are provided in a main body cover, and it is necessary to particularly keep a place for handling a semiconductor wafer such as a sample chamber at a constant temperature in a situation where the devices generate heat and heat easily accumulates in the main body cover.

The present invention has been made in view of the above problem, and it is an object of the present invention to suppress entry of electromagnetic noise and noise from the outside and to suppress an influence of heat generated by a control device on a semiconductor without installing a large exhaust device in a semiconductor processing apparatus.

A semiconductor processing apparatus according to the present invention includes a main body cover that covers a main body device and a control device. The main body cover has a transfer opening for transferring a semiconductor, and the main body cover further has an intake port that generates an air flow in a horizontal direction inside the main body cover.

By using the above configuration, the semiconductor processing apparatus prevents entry of electromagnetic noise and a sound wave from the outside, prevents a phenomenon in which heat generated by a control device having a contradictory relationship accumulates in the cover, and, in order to prevent accumulation of the heat, efficiently exhausts heat with a low-output fan without using a large fan that causes vibration and noise. In this manner, the temperature of the air around the main body device that handles a semiconductor is prevented from increasing to the temperature of a clean room or more, thermal deformation and vibration influence of the main body device are prevented, and precise operation of the semiconductor processing apparatus is realized.

DESCRIPTION OF THE PREFERRED EMBODIMENT

Figure 1:
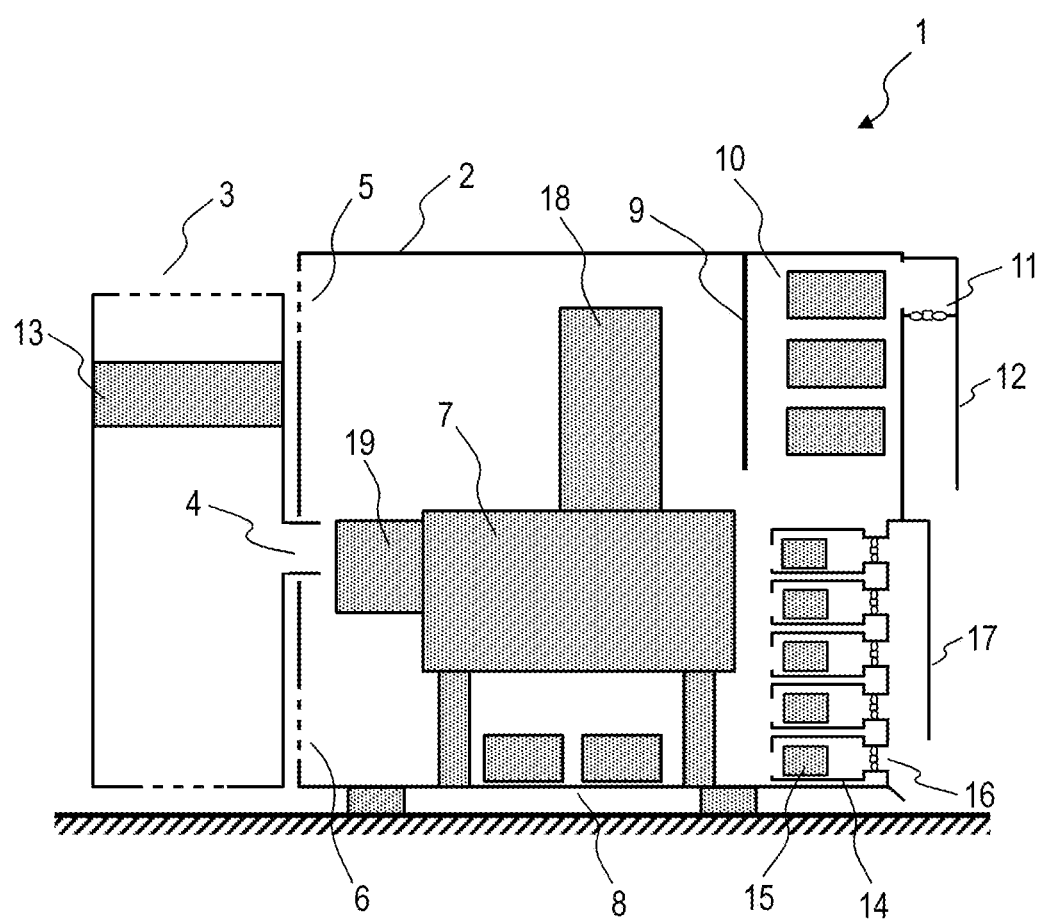
FIG. 1 is a diagram showing an overall configuration of a semiconductor processing apparatus.

FIG. 1 is a diagram illustrating an overall configuration of a semiconductor processing apparatus 1 according to an embodiment of the present invention. The semiconductor processing apparatus 1 is divided into a region covered with a main body cover 2 and a semiconductor transfer device 3. The main body cover 2 accommodates a main body device. The main body device is a device that inspects and processes a semiconductor. In the present embodiment, a critical dimension SEM will be described as an example of the main body device. However, the present invention can also be used in other semiconductor manufacturing apparatuses and the like.

Various processing steps of a semiconductor are performed by various apparatuses installed in a clean room, and when a semiconductor wafer is moved between the apparatuses, the semiconductor wafer is conveyed in a pod. The pod is completely sealed to prevent minute foreign matters from adhering to the surface of the wafer. However, when the semiconductor wafer is taken out from the pod and transferred to a processing apparatus, there is a possibility that a minute foreign matter adheres due to exposure to the air in the clean room. Therefore, the semiconductor transfer device 3 includes a fan filter unit (FFU) 13, sucks air in the clean room with a fan, cleans the air through a filter, and causes the clean air to uniformly flow downward, so as to create a locally clean environment. In the semiconductor transfer device 3, a semiconductor wafer is taken out by a robot hand after the wafer is to be brought into contact with clean air from the time the pod is opened, and the wafer is transferred to the main body device.

In the critical dimension SEM, a semiconductor wafer is imaged using a scanning electron microscope, and a line width or the like of a circuit formed on the wafer is measured from the image, so as to inspect the circuit. In FIG. 1, the above is performed by an electron microscope 18. In using the electron microscope 18, it is necessary to prevent air from interfering with the track of an electron beam. Accordingly, a sample to be imaged is placed in a high vacuum environment. For this purpose, there is a sample chamber 7 integral with the electron microscope 18, keeping the inside in high vacuum. A stage device is installed in the sample chamber 7, and the stage is mounted with a semiconductor wafer and moves the wafer to an optional place, so that a place to be imaged by the electron microscope 18 can be optionally selected. In a recent semiconductor circuit, a minimum line width is configured on the order of nanometers, and in inspecting the semiconductor circuit, it is necessary to perform imaging at a magnification corresponding to an inspection target, and an imaging range becomes smaller as the magnification is increased. In contrast, when a temperature change occurs in the stage device that positions a semiconductor wafer, the position of the wafer is moved by thermal deformation of the stage even if the stage device is fixed. At this time, when the critical dimension SEM performs imaging in a very narrow range, there may be a situation where an imaged location on the wafer becomes uncertain. Therefore, it is necessary to be careful not to cause a temperature change in the stage device, and for this purpose, it is necessary not to cause a temperature change in the sample chamber 7 housing the stage device. For this reason, it is necessary to minimize a temperature change of the air surrounding the sample chamber 7.

The inside of the sample chamber 7 needs to be kept in high vacuum. However, since a semiconductor wafer to be put into the sample chamber 7 is carried in an environment of atmospheric pressure, there is a semiconductor in-out device 19 for a sample chamber in order to interpose the two environments. The semiconductor in-out device 19 for a sample chamber receives a wafer from the semiconductor transfer device 3 in an open state under atmospheric pressure, closes an entrance and then performs vacuuming, and, after the pressure approaches a degree of vacuum of the sample chamber 7, opens a shutter between them, and transfers the wafer from the in-out device 19 to a stage device in the sample chamber 7.

In order to avoid adhesion of a minute foreign matter in a period after a semiconductor wafer is taken out of the pod until the wafer is stored in the semiconductor in-out device 19 for a sample chamber, the wafer needs to be surrounded by clean air during that period. In view of the above, the clean air supplied by the FFU 13 of the semiconductor transfer device 3 flows toward the inside of the main body cover 2 through a semiconductor transfer unit 4 in addition to forming a downward flow in the semiconductor transfer device 3. In order to create such a flow, it is necessary to make the pressure on the semiconductor transfer device 3 side higher than the pressure inside the main body cover 2 in the semiconductor transfer unit 4. As a means for the above, resistance is generated in the flow in a location where the air supplied from the FFU 13 goes out in a lower portion of the semiconductor transfer device 3. Specifically, for example, a flow path area of an exhaust port of the semiconductor transfer device 3 is reduced. In this manner, a space for handling a wafer inside the semiconductor transfer device 3 is set to have a positive pressure with respect to the outside.

In addition to the main body device (the electron microscope 18, the sample chamber 7, and the in-out device 19), various control devices for driving the main body device are arranged in the main body cover 2. A part of control devices 8 is disposed below the sample chamber 7, and another part of control devices 10 is disposed in a space on the back side of the sample chamber 7. These control devices generate heat according to consumed power, and it is preferable to dispose the control devices at intervals in order to release the heat. However, when such a design is made, the size of the semiconductor processing apparatus increases, and an occupying area in the clean room increases. The clean room is required to continuously supply clean and temperature- and humidity-controlled air, and requires large operation cost. Therefore, an increase in the occupying area in the clean room means that large operation cost is required. Therefore, the semiconductor processing apparatus 1 is required to be as small as possible. However, as devices are mounted at a high density, heat is more likely to be trapped, and a temperature rise due to the heat becomes an obstacle to precise operation. Accordingly, there are contradictory objects.

In order to sufficiently dissipate heat in a high-density mounted apparatus, it is effective to ventilate with a strong fan. However, in a semiconductor processing apparatus, noise of a fan also becomes a problem. That is, fan noise causes pressure fluctuation on an apparatus surface by a sound wave generated by the fan noise, the apparatus is shaken by the fluctuation pressure causing vibration, and the influence of the vibration appears on precision operation on the order of nanometers. Therefore, when the inside of the main body cover 2 is ventilated by the fan, it is necessary to obtain a necessary and sufficient effect with a lower output fan. In order to solve these problems, a structure applied to the main body cover 2 will be described in detail with reference to FIG. 2A.

Figure 2A:
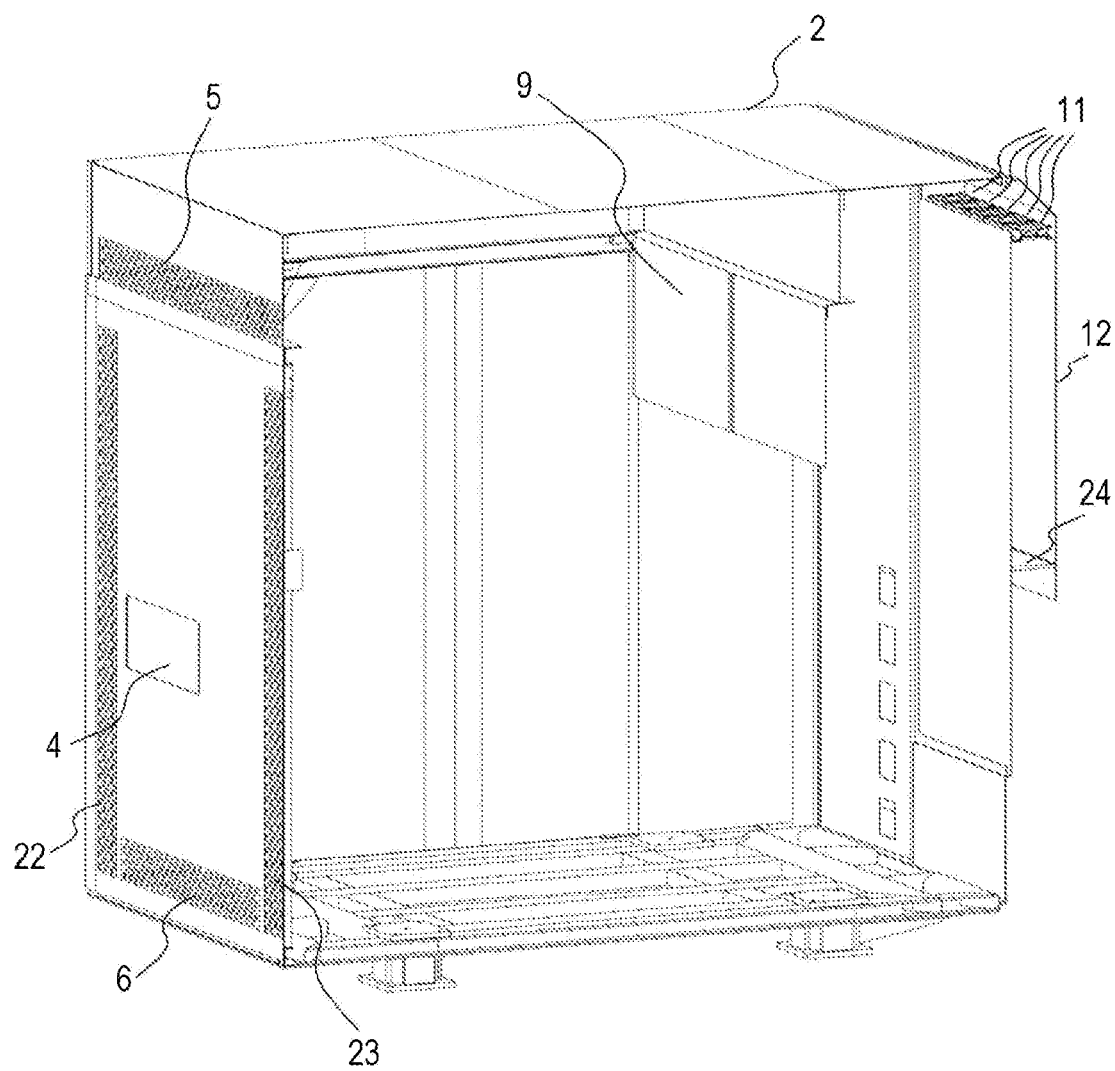
FIG. 2A is a diagram taking up only a main body cover and illustrating the inside of the main body cover in an open manner.

FIG. 2A is a diagram taking up only the main body cover 2 and illustrating the inside of the main body cover 2 in an open manner. As a configuration for efficient ventilation, an exhaust fan 11 is installed in an upper portion on the back side of the main body cover 2, and air is exhausted downward through an exhaust duct 12. Since air warmed by heat generated by a control device flows upward by natural convection, installing the exhaust fan 11 in the upper portion leads to discharge of more warmed air. When the exhaust fan 11 discharges air whose temperature is not increased so much, air whose temperature is increased accumulates in another location, and a temperature increase suppressing effect is lowered. Therefore, installing the exhaust fan 11 in the upper portion on the back side in the main body cover 2 leads to the fan sucking and exhausting air whose temperature is increased most, which is an effective method of using the fan.

An upper region in the main body cover 2 is, for example, a region above the center in the height direction, and a lower region is, for example, a region below the center in the height direction. However, the present invention is not strictly limited to this, and as long as a relative positional relationship between a device disposed in an upper portion and a device disposed in a lower portion is vertical, the same effect can be exhibited to this extent. The same applies to description below.

As the exhaust fan 11, a plurality of propeller-type axial fans are arranged side by side and used. The axial fan is suitable for producing a large flow rate at a low pressure as compared to other types of fans. In order for the axial fan to flow more air, it is necessary to increase the rotation speed of a blade or increase the diameter of the blade. However, when the rotation speed of the blade is increased, wind noise becomes large and noise becomes large. Further, when the diameter of the blade is increased, the fan becomes large, and the size of the entire apparatus increases. In view of the above, in order to increase a flow rate with a low-noise fan without increasing the apparatus size, it is suitable to secure a flow rate by arranging the axial fans side by side and increasing the number of fans.

A plate 24 having a metal honeycomb structure is installed inside the exhaust duct 12 to suppress entry of an electromagnetic wave while allowing air to pass through. In the honeycomb structure, a large number of flow paths having a hexagonal cross-sectional shape can be formed, and if a wall of the honeycomb is formed thin, a decrease in a flow path area can be suppressed, so that an obstacle for flowing air can be reduced. In contrast, when an electromagnetic wave passes through a pipe line having a small diameter, attenuation proportional to pipe line length/pipe line diameter can be expected. Therefore, by installing a plate having a honeycomb structure, it is possible to suppress the pressure loss in the flow of air and to increase the attenuation of an entering electromagnetic wave.

As a next configuration for efficient ventilation, a partition plate 9 is provided inside the main body cover 2. In a case where a control device is installed on the back side of the main body device, air whose temperature is increased due to exhaust heat of the control device flows upward by natural convection. However, some individual devices have a fan themselves and it is difficult to form a uniform air flow, and warm air is likely to be diffused by forces flowing in various directions. In view of the above, by partitioning an upper space in which air is particularly warmed into a space for the control device and a space for the main body device, it is possible to prevent warmed air from diffusing around the main body device. In contrast, in order to suppress the air temperature increase itself, it is effective to create a flow of a large amount of air with a small driving force. Therefore, the partition plate 9 is installed only in an upper space, so that air easily flows in a lower space.

As a next configuration for efficient ventilation, an upper intake port 5 and a lower intake port 6 are provided on a front surface of the main body cover 2. In ventilating air in the main body cover 2, first, air flowing from the semiconductor transfer device 3 through the semiconductor transfer unit 4 is used as an air supply source. After that, if the main body cover 2 is provided with an opening so that external air can be sucked, a larger ventilation flow rate can be realized. However, when the opening is provided on the main body cover 2, electromagnetic noise and noise easily enter from the opening. As a countermeasure, the opening portion has a structure in which a large number of small-diameter holes are provided. In this manner, the passage of electromagnetic noise is somewhat weakened. After that, by providing the intake ports 5, 6, 22, and 23 in a location on the back side of the semiconductor transfer device 3, entry of electromagnetic noise and noise is suppressed. That is, electromagnetic noise and noise coming from the front are reflected by the semiconductor transfer device 3 and direct entry is avoided.

For electromagnetic noise and noise coming from a side surface, since an opening surface does not face the side surface, direct entry can be avoided. After that, air flowing in from the intake ports 5 and 6 can flow in the horizontal direction after entering the main body cover 2.

For example, when the intake port 5 is not provided, air flowing in from the semiconductor transfer unit 4 flows in the right direction in the drawing of FIG. 1. However, since there is a large space above the sample chamber 7, it has been found by the research of the present inventors that a counterclockwise flow is generated in the space. When such a large vortex exists, air that is warmed by exhaust heat of a control device is significantly diffused, and an air temperature around the main body device is also increased to some extent. In contrast, when the intake port 5 is present, a rightward flow is given to the upper side of the counterclockwise vortex, and the counterclockwise vortex can be canceled. When this vortex disappears, the flow of the air becomes horizontal, and an air temperature increase around the main body device is avoided. In particular, since the temperature of air surrounding the sample chamber 7 is important for precision operation, such a flow of air contributes to high accuracy of semiconductor processing inside the apparatus. Air flowing in from the lower intake port 6 contributes to cooling of the control device 8 disposed below the sample chamber 7, prevents air whose temperature is increased due to exhaust heat of the control device 8 from reaching a bottom surface of the sample chamber 7, and contributes to stabilization of an ambient temperature of the sample chamber 7.

As illustrated in FIG. 2A, it is also effective to further provide the intake ports 22 and 23 provided with a large number of small-diameter holes on two sides on left and right of a front surface of the main body cover 2. That is, even the left and right intake ports are on the back side of the semiconductor transfer device 3. Accordingly, similarly to the intake ports 5 and 6, there is an effect of suppressing entry of electromagnetic noise and noise and making sucking of air for ventilation easy. Further, by installing an intake port installed on the front surface of the main body cover 2 closer to an edge than a central portion, the pressure loss with respect to inflow of air is reduced, which contributes to realizing a larger ventilation flow rate with a lower output exhaust fan.

Reference is made again to FIG. 1. After control devices including a heating element 15 are stacked in a housing 14 and mounted at high density, an exhaust fan 16 is installed in each housing, and the stacked exhaust fans are connected by an exhaust duct 17, so that exhaust is performed downward to the outside of the main body cover 2. With such a configuration, the heating element 15 can be cooled by the exhaust fan 16, and at the same time, exhaust can be performed from the main body cover 2 to the outside using a discharge flow of the exhaust fan 16, and a ventilation flow rate in the main body cover can be increased. Further, the cooling of the control device 8 and the cooling of the heating element 15 are continuously performed using the flow of air flowing in from the lower intake port 6 of the front surface of the main body cover, and at the same time, this contributes to keeping the flow of air in the main body cover 2 horizontal. That is, keeping the flow horizontal leads to prevention of generation of a large vortex, and makes it possible to wrap the sample chamber 7 constantly with air whose temperature is not increased.

Figure 2B:
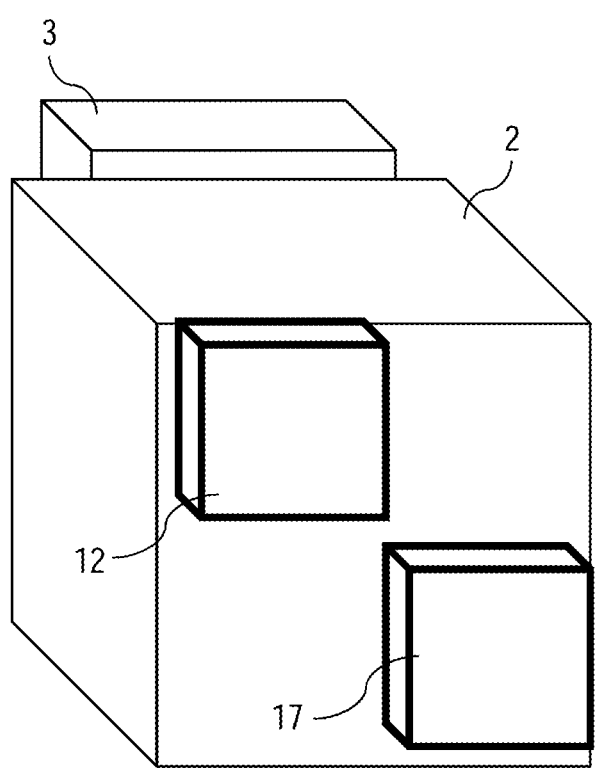
FIG. 2B is a schematic view illustrating a positional relationship between exhaust ducts.

FIG. 2B is a schematic view illustrating a positional relationship between the exhaust ducts 12 and 17. The exhaust ducts 12 and 17 are disposed in a back surface portion of the main body cover 2 and are shifted from each other in the horizontal direction. That is, the control device 10 is disposed on one of the left and right sides of the upper space inside the main body cover 2, and the housing 14 is disposed on the other side in the left-right direction of the lower space inside the main body cover 2. The exhaust ducts 12 and 17 are also disposed according to this arrangement relationship. In this manner, it is not necessary to configure the exhaust ducts 12 and 17 as a series of one exhaust duct. Accordingly, it is possible to suppress a blowing resistance by forming each exhaust duct short, and to downsize the exhaust fan. Furthermore, by shifting the exhaust ducts 12 and 17 in the horizontal direction, an exhaust port of the exhaust duct 12 can be prevented from being covered by the exhaust duct 17, and a wide exhaust port can be secured. Although the exhaust port of the exhaust duct 12 and the exhaust duct 17 may partially overlap each other in the horizontal direction, it is not preferable that the exhaust port and the exhaust duct 17 completely overlap each other because the exhaust port becomes small.

A specific example of a structure in which housings provided with an exhaust fan are stacked and mounted at high density will be described with reference to FIGS. 3, 4, and 5. In the present embodiment, a power supply unit incorporating a plurality of switching power supplies in a housing will be described as an example.

Figure 3:
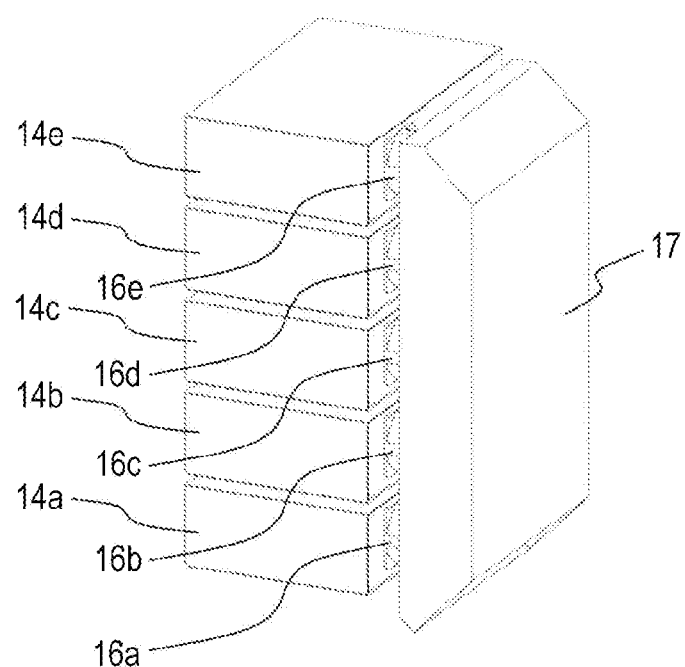
FIG. 3 is an external view of a housing.

FIG. 3 is an external view of the housing 14. For convenience of description, constituents divided into a plurality of portions are distinguished by an alphabetic suffix. An exhaust fan 16a is attached to a housing 14a, an exhaust fan 16b is attached to a housing 14b, an exhaust fan 16c is attached to a housing 14c, an exhaust fan 16d is attached to a housing 14d, and an exhaust fan 16e is attached to a housing 14e. These five exhaust fans are connected by the exhaust duct 17, and perform exhaust downward to the outside.

Figure 4:
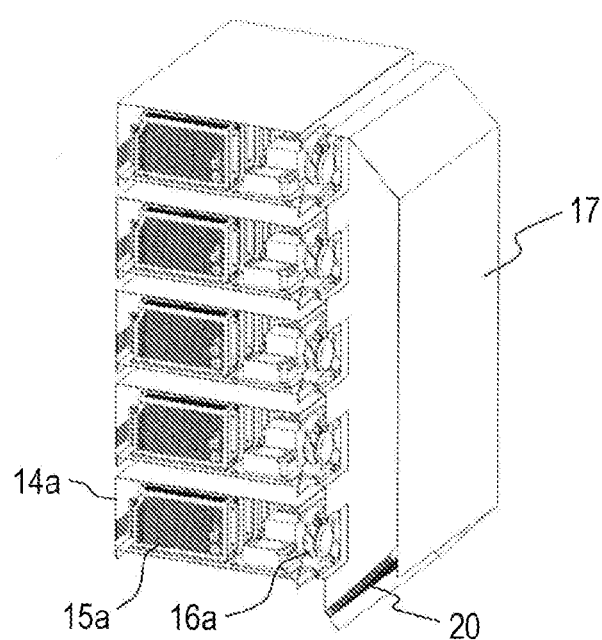
FIG. 4 is a diagram illustrating a structure inside the housing in an open manner.

FIG. 4 is a diagram illustrating a structure inside the housing 14 in an open manner. Here, a switching power supply 15 is exemplified as an example of the heating element 15. A switching power supply 15a corresponding to a heating element is housed in the housing 14a. The exhaust duct 17 has a structure in which only a location connected to the exhaust fan 16 and an outlet are open and the remaining portion is closed. Furthermore, a honeycomb for reducing entry of electromagnetic noise is installed at the outlet of the exhaust duct 17. In the exhaust duct of the present embodiment, since a total flow rate of the five fans is discharged, a pressure loss associated with a high flow speed is likely to occur. When the pressure loss becomes large, a high-output fan is required to overcome the pressure loss, and noise generation increases. Therefore, it is preferable for the semiconductor processing apparatus to design the apparatus to provide a flow path cross-sectional area and an outlet opening as large as possible to reduce the pressure loss, so that the heat dissipation capability is established with a low-output fan. In contrast, when the outlet opening area of the exhaust duct 17 is made large, electromagnetic noise from the outside easily enters. In view of the above, a plate having a honeycomb-shaped cross-sectional structure made from metal is manufactured and installed in an outlet opening portion of the exhaust duct 17. By installing the plate having the honeycomb structure so as to be inclined from the horizontal position, it is possible to secure a larger flow path area than in a case where the plate is installed horizontally.

The plate 24 in the exhaust duct 12 can also be disposed in an inclined manner. However, in such a case, exhaust air from the exhaust duct 12 is discharged slightly sideways from directly below. This increases the possibility that exhaust air hits other apparatuses adjacent to the semiconductor processing apparatus 1, which may be undesirable. In such a case, the plate 24 is desirably not inclined. However, since the exhaust duct 17 is disposed in a lower region, even if the exhaust gas is discharged sideways, the influence on other apparatuses is considered to be small.

Figure 5:
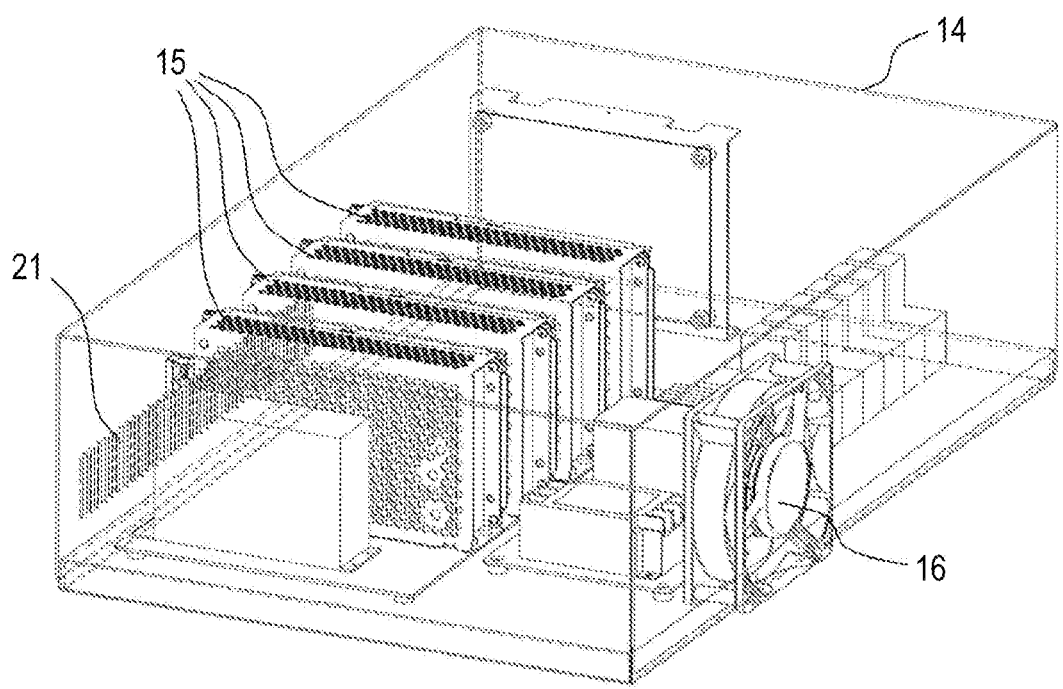
FIG. 5 is a diagram illustrating a configuration of a power supply unit.

FIG. 5 is a diagram illustrating a configuration of a power supply unit according to the present embodiment. In the present configuration, four switching power supplies are arranged side by side in the housing 14. This switching power supply serves as a DC power supply of another control device. As the semiconductor processing apparatus 1 uses a large number of control devices, a large number of power supplies are also required. A power supply device can be provided separately. However, in that case, a large number of cables for supplying power are required. Compared with a power supply using a transformer, use of a switching power supply enables miniaturization and low heat generation. Therefore, by mounting a large number of switching power supplies in the housing and disposing such housings in a stacked manner, it is possible to reduce a large number of cables required in a case of a separate power supply when power supplies of all control devices are installed in the main body cover 2 of the semiconductor processing apparatus 1. In contrast, since the power supply device handles a large amount of power, heat generation tends to become large, and even when a switching power supply is used, certain heat generation occurs. In view of the above, when a plurality of switching power supplies are disposed in a housing and cooling air is supplied by a fan having a relatively large diameter, the switching power supply can be efficiently cooled.

As a cooling structure at this time, the exhaust fan 16 that discharges air in the housing 14 is installed, and an intake port 21 is provided on the opposite surface. In the present embodiment, in order to reduce the electromagnetic noise passing through the intake port 21 as much as possible, a large number of thin elongated holes are provided as the intake port. In addition to the above, it is also possible to form the intake port by providing a large number of round holes having a small diameter.

In the switching power supply 15, a longest side of an outer shape of a rectangular parallelepiped is installed in parallel with the direction from the intake port to the exhaust fan, and a next longest side is installed in the vertical direction. Then, the switching power supplies 15 are arranged in the direction of a shortest side. The inside of the housing 14 has a negative pressure by the operation of the exhaust fan 16. In this manner, air is sucked from the intake port 21. At this time, since air flows perpendicularly to an opening surface of the intake port 21, the intake port can be installed so that the flow hits each of the switching power supplies. In this manner, it is possible to cool a large number of switching power supplies with a fan having a minimum necessary output and simultaneously perform ventilation in the main body cover.

By disposing the switching power supply 15 as described above, a plurality of the switching power supplies 15 are densely disposed in the housing 14, and a large contact area between the air flow and the switching power supply 15 is secured, so that cooling can be efficiently performed.

Variation of Present Invention

In the above embodiment, the critical dimension SEM is described as an example of the main body device of the semiconductor processing apparatus 1 that inspects or processes a semiconductor. However, the present invention can also be applied to other semiconductor processing apparatuses. For example, in a semiconductor processing apparatus such as an exposure apparatus, the main body device can be covered with the main body cover 2 similarly to the present invention, and the exhaust in the main body cover 2 can be made efficient to mitigate the influence on a semiconductor.

What is claimed is:

1. A semiconductor processing apparatus comprising:
    a main body device that inspects or processes a semiconductor;
    a control device that controls the main body device; and
    a transfer device that transfers the semiconductor to and from the main body device,
    the semiconductor processing apparatus further comprising a main body cover that covers the main body device and the control device, wherein
    the main body cover has a transfer opening for transferring the semiconductor to and from the transfer device,
    the transfer device has a fan filter unit configured to generate a downward air flow inside the transfer device, apply the downward air flow to the semiconductor, and send the downward airflow to the main body cover through the transfer opening,
    the main body cover further has an upper intake port that generates an air flow in a horizontal direction in an upper region inside the main body cover, and
    the main body cover further has an exhaust port that exhausts an air flow in the horizontal direction in the upper region.

2. The semiconductor processing apparatus according to claim 1, wherein
    the main body cover further has a lower intake port that generates an air flow in the horizontal direction in a lower region inside the main body cover, and
    the main body cover further has an exhaust port that exhausts an air flow in the horizontal direction in the lower region.

3. The semiconductor processing apparatus according to claim 1, wherein
    the main body cover has the transfer opening on a front surface side,
    the main body cover further has a first exhaust fan in an upper portion on a back surface side inside the main body cover, and
    the main body cover further has a first exhaust duct that guides air discharged by the first exhaust fan downward.

4. The semiconductor processing apparatus according to claim 3, wherein
    the first exhaust fan is configured by arranging a plurality of axial fans in parallel.

5. The semiconductor processing apparatus according to claim 3, wherein
    a metal plate having a honeycomb structure is disposed in an exhaust path of the first exhaust duct.

6. The semiconductor processing apparatus according to claim 1, wherein
    a part of the control device includes an upper control device disposed in an upper portion on a back surface side inside the main body cover,
    a partition plate is disposed in an upper region inside the main body cover, and
    the partition plate is disposed between the upper control device and the main body device.

7. The semiconductor processing apparatus according to claim 2, wherein
the upper intake port and the lower intake port are configured by arranging a plurality of openings.

8. The semiconductor processing apparatus according to claim 1, wherein
the main body cover further has side intake ports disposed on both side portions of the transfer opening, and
each of the side intake ports is configured by arranging a plurality of openings.

9. The semiconductor processing apparatus according to claim 1, wherein
a part of the control device includes a lower control device disposed in a lower portion on a back surface side inside the main body cover,
the semiconductor processing apparatus further comprising a lower control device housing that is disposed in a lower region on a back surface side inside the main body cover and houses the lower control device, wherein
the lower control device is configured by stacking and arranging a plurality of control devices, and
the lower control device housing has a second exhaust fan that exhausts air inside the lower control device.

10. The semiconductor processing apparatus according to claim 3, wherein
a part of the control device includes a lower control device disposed in a lower portion on a back surface side inside the main body cover,
the semiconductor processing apparatus further comprising a lower control device housing that is disposed in a lower region on a back surface side inside the main body cover and houses the lower control device, wherein
the lower control device housing has a second exhaust fan that exhausts air inside the lower control device and a second exhaust duct that guides air exhausted by the second exhaust fan downward, and
the first exhaust duct and the second exhaust duct are disposed so as to be shifted from each other in the horizontal direction so that an exhaust port of the first exhaust duct is not covered by the second exhaust duct.

11. The semiconductor processing apparatus according to claim 1, wherein
a part of the control device includes a lower control device disposed in a lower portion on a back surface side inside the main body cover,
the semiconductor processing apparatus further comprising a lower control device housing that is disposed in a lower region on a back surface side inside the main body cover and houses the lower control device, wherein
the lower control device housing has a second exhaust fan that exhausts air inside the lower control device and a second exhaust duct that guides air exhausted by the second exhaust fan downward, and
a metal plate having a honeycomb structure is disposed in an exhaust path of the second exhaust duct.

12. The semiconductor processing apparatus according to claim 11, wherein
the metal plate is disposed to be inclined with respect to an extending direction of the exhaust path of the second exhaust duct.

13. The semiconductor processing apparatus according to claim 9, wherein
the lower control device housing has the second exhaust fan on a back surface and a housing intake port on a front surface, and
the housing intake port includes a plurality of holes.

14. The semiconductor processing apparatus according to claim 9, wherein
the lower control device is a power supply unit that supplies power to the control device other than the lower control device, and
the power supply unit includes a switching element.

15. The semiconductor processing apparatus according to claim 14, wherein
a shape of the power supply unit has a short side and a long side, and the long side extends along an air flow discharged by the second exhaust fan, and
the lower control device is configured by arranging a plurality of the power supply units in parallel in a direction orthogonal to the air flow.

* * * * *